United States Patent [19]

Yoshida

[11] 4,259,662
[45] Mar. 31, 1981

[54] THRESHOLD SETTING CIRCUIT

[75] Inventor: Hajime Yoshida, Tokyo, Japan

[73] Assignee: Hajime Industries, Ltd., Tokyo, Japan

[21] Appl. No.: 70,908

[22] Filed: Aug. 29, 1979

[30] Foreign Application Priority Data

Aug. 31, 1978 [JP] Japan .................. 53/106613

[51] Int. Cl.³ .............................................. G06K 9/38
[52] U.S. Cl. .......................................... 340/146.3 AG
[58] Field of Search ............ 340/146.3 AG; 307/358, 307/351, 353

[56] References Cited

U.S. PATENT DOCUMENTS

| | | | |
|---|---|---|---|
| 3,225,213 | 12/1965 | Hinrichs et al. | 340/146.3 AG |
| 3,502,993 | 3/1970 | Schürzinger et al. | 340/146.3 AG |
| 3,668,634 | 6/1972 | Kruklitis | 340/146.3 AG |
| 3,675,201 | 7/1972 | McKissick et al. | 340/146.3 AG |
| 3,701,099 | 10/1972 | Hall et al. | 340/146.3 AG |
| 3,820,068 | 6/1974 | McMillin | 340/146.3 AG |
| 4,034,342 | 7/1977 | Kruklitis | 340/146.3 AG |

Primary Examiner—Leo H. Boudreau

[57] ABSTRACT

A threshold setting circuit having a detector for detecting the brightest or highest level of a screen which consists of a plurality of picture elements and a device for setting a threshold value by suitably reducing the brightest or highest level detected by the detector.

3 Claims, 7 Drawing Figures

THRESHOLD SETTING CIRCUIT

BACKGROUND OF THE INVENTION

1. Field of the Invention

The present invention relates generally to a threshold value setting circuit, and is directed more particularly to a threshold value setting circuit suitable for use with an apparatus for extracting a specific pattern.

2. Description of the Prior Art

In the art, there have been proposed various methods to catch picture information from a video sensor or the like and then to extract a specific pattern from the picture information. For example, it is proposed that when a screen, which consists of a number of picture elements arranged in the vertical and horizontal direction (or mesh pattern), is scanned, the screen is divided into a plurality of small picture screens each consisting of $3 \times 3 = 9$ picture elements which is then detected to determine whether a specific pattern exists on the screen or not. In such a case, it is usual that the extraction of the specific pattern is achieved with the information being divided into two values of white and black. Namely, in general, such a floating method is used in which a certain threshold value is set for the zero potential and then a value higher than the threshold value is judged as the white level while a value lower than the threshold level is judged as a black level, or an average value of the bright and dark levels of a picture screen is set as a threshold level and then the + side thereof is judged as the white level while the − side thereof is judged as the black level.

In the above threshold value setting method, it becomes a problem how to set the threshold value without being affected by scratches, dirty portions and so on of a pattern, how to adjust the light source which will irradiate the picture screen, and how to adjust the gain of an amplifier used therein. That is, if much attention is not paid to the above operations, it is impossible to accurately extract a specific pattern.

Now, an example of the prior art pattern extracting method will be described with reference to FIGS. 1A, 1B, 2A, 2B, 3A, 3B, 4A and 4B. As shown in the figures, a picture screen (the whole screen is not shown in the figure) is divided into a plurality of small picture screens each consisting of $3 \times 3 = 9$ picture elements P1, P2, ... P8, P9 which are arranged in the vertical and horizontal directions (one small picture screen is shown in FIGS. 1A to 3B). In this case, an inverse L-shaped pattern PL, which is an example of the specific patterns, will be extracted from the screen. Therefore, in this case, the specific pattern PL is projected onto the picture elements P1, P2, P3, P4 and P7 of the small picture screen as shown in FIGS. 1A, 2A and 3A. If it is assumed that the information from the respective picture elements are accurately made as two values, the picture elements P1, P2, P3, P4 and P7 become the black level, while the picture elements P5, P6, P8 and P9 become the white level as shown in FIG. 1B.

While, if, for example, a dirty portion exists on one of picture elements such as the picture element P8 as shown in FIG. 2A, the information from the picture element P8, which should be in the white level, may be judged as the black level as shown in FIG. 2B dependent upon the manner in which the threshold value is set.

That is, as shown in FIG. 4A by a dotted line, if a threshold value SH is set at a relativly high value near a white level W (in FIG. 4A, WL represents a portion of the white level and IL and BL respectively represent black level portions), the picture element P8, which contains the dirty portion, is at a level lower than the threshold level SH (in this case, it becomes the level IL). Thus, the picture element P8 is erroneously judged as the black level, and accordingly it becomes impossible to accurately judge the pattern.

In order to avoid the above erroneous judgement, if the threshold value is lowered to SHL40 as shown in FIG. 4B by a dotted line, another defect will be caused. That is, if, for example, a scratch is present on, for example, the picture element P2 (on which a part of the pattern PL is projected and hence which is in the black level) as shown in FIG. 3A, the level of the picture element P2 becomes the level IL and is higher than the threshold level SH' as shown in FIG. 4B. Thus, the picture element P2 is erroneously judged as the white level. Accordingly, the case of FIG. 3A is such that a part of the black portion of the small picture screen is cut away i.e. the picture element P2, which is to be a black portion by the projection of the pattern, becomes the white level as shown in FIG. 3B.

Accordingly, in the prior art, the threshold value must be carefully set in consideration of various conditions as set forth above, which is troublesome and further, the threshold value is easily affected by the background of the pattern.

OBJECTS AND SUMMARY OF THE INVENTION

Accordingly, it is an object of the present invention to provide a novel threshold value setting circuit.

It is another object of the invention to provide a threshold value setting circuit which is effective when it is employed in extracting a specific pattern.

It is a further object of the invention to provide a threshold value setting circuit which can avoid the erroneous judgement of a pattern when it is used in extracting a specific pattern.

According to an aspect of the invention, a threshold value setting circuit is provided which comprises a means for detecting the brightest or highest level of a screen which consists of a number of picture elements, and means for reducing the brightest or highest level to thereby set a threshold value.

The other objects, features and advantages of the present invention will become apparent from the following description taken in conjunction with the accompanying drawings through which the like references designate the same elements and parts.

DESCRIPTION OF THE PREFERRED EMBODIMENT

The present invention will be hereinafter described with reference to the attached drawings.

In the following description, such a case will be described in which the present invention is applied to extract a specific pattern such as an inverse L-shaped pattern which is projected on a small picture screen consisting of, for example, $3 \times 3 = 9$ picture elements which are arranged in the vertical and horizontal directions as described in connection with the description of the prior art.

Figure 1A:
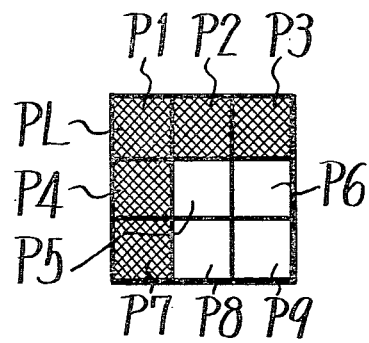
FIGS. 1A, 1B, 2A, 2B and 3A, 3B are schematic diagrams explaining the prior art, respectively.
Figure 1B:
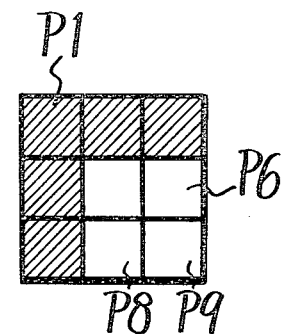
Figure 2A:
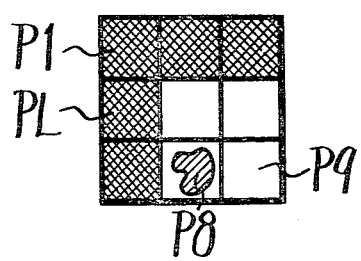
Figure 2B:
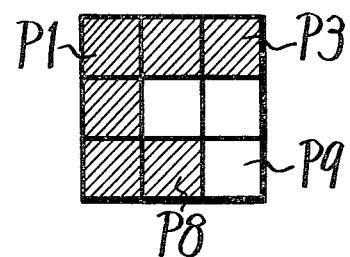
Figure 3A:
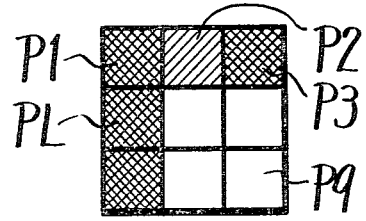
Figure 3B:
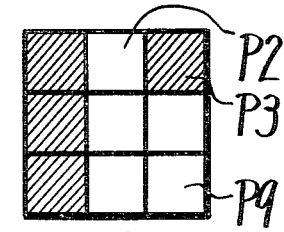
Figure 4A:
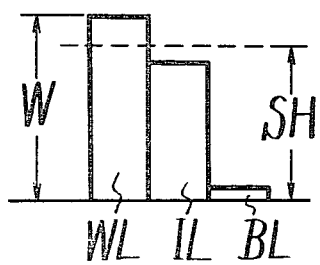
FIG. 4A and 4B are graphs used for explaining the prior art.
Figure 4B:
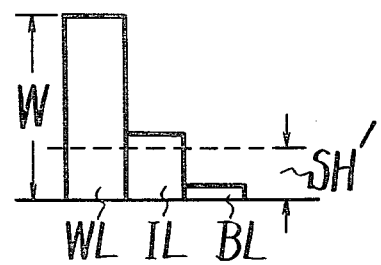
Figure 5:
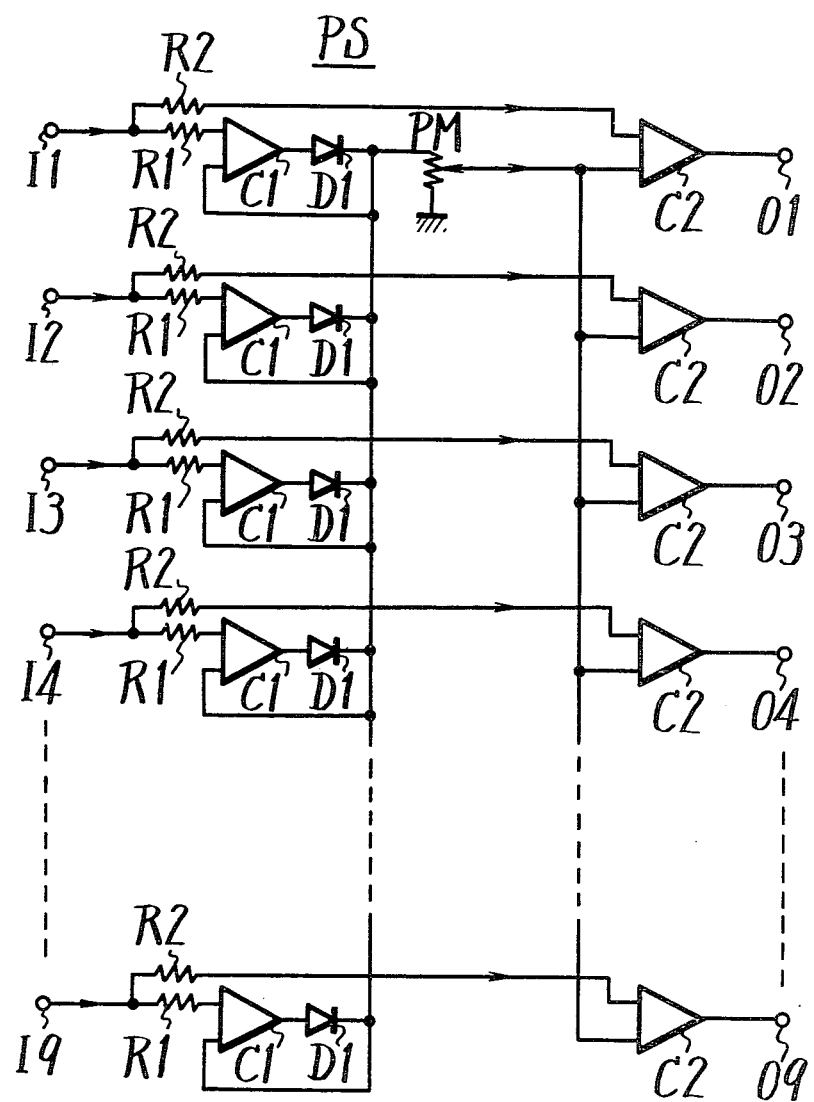
FIG. 5 is a circuit diagram, partially in block, showing an example of the threshold value setting circuit according to the present invention.

Turning to FIG. 5, an example of the threshold value setting circuit according to the present invention will be described. In FIG. 5, references I1, I2, ..., I9 designate input terminals to which the picture informations from picture elements P1, P2, ... P9 forming a divided small picture screen (shown in FIG. 6) are applied. The input terminals I1, I2, ... I9 are respectively connected through resistors R1 to one of the input terminals of the operational amplifiers C1, and the output terminals of the respective operational amplifiers C1 are connected through diodes D1 in the forward direction to the other one of the input terminals of the operational amplifiers C1. In this case, each of the triplets consisting of the operational amplifier C1, resistor R1 and diode D1 forms a so-called peak selector PS. The cathodes of the diodes D1 connected to the output terminals of the respective operational amplifiers C1 are connected together to a potentiometer PM which will set a common threshold value. The output terminal i.e. the movable piece of the potentiometer PM is commonly connected to one of the input terminals of each of a plurality of comparator C2, which correspond in number to the respective sets of the diode D1, operational amplifier C1 and resistor R1, and the input terminals I1, I2, ... I9 are respectively connected to the other one of the input terminals of each of the comparators C2 through resistors R2. From the output sides of each of the comparators C2 there is led output terminals 01, 02, ... 09, respectively. The output signals delivered to the output terminals 01 to 09 will be supplied to a computer (not shown) in which the pattern extraction is carried out by the known technique. Therefore, the description thereof will be omitted.

In the example of the invention shown in FIG. 5, the cathodes of the respective diodes D1 are connected together, so that only the operational amplifier C1, to which the information signal having the highest voltage of all of the signals applied to the input terminals I1 to I9 corresponding to the picture elements P1 to P9 is supplied, functions as a half-wave rectifier circuit and only the output therefrom is applied to the potentiometer PM. Accordingly, the signal, which is commonly applied to the respective comparators C2 from the potentiometer PM as the reference level (threshold value) thereof, is equal with one another and always corresponds to the highest level (peak value) of the picture screen or small picture screen. In other words, the reference level for the comparators C2 is the level or threshold value which corresponds to the highest level (peak value) lowered or reduced suitably by the potentiometer PM. Thus, each of the respective comparators C2 compares its input signal with the same reference level or threshold value so as to judge the input signal to be one of two values or black and white levels. In other words, the threshold value of the example of the invention shown in FIG. 5 is automatically set to a value provided by suitably reducing the highest level of the input signals through the potentiometer PM.

Next, a case where the above threshold value setting circuit of the invention is used to judge a pattern will be described with reference to FIGS. 6 and 7.

Figure 6:
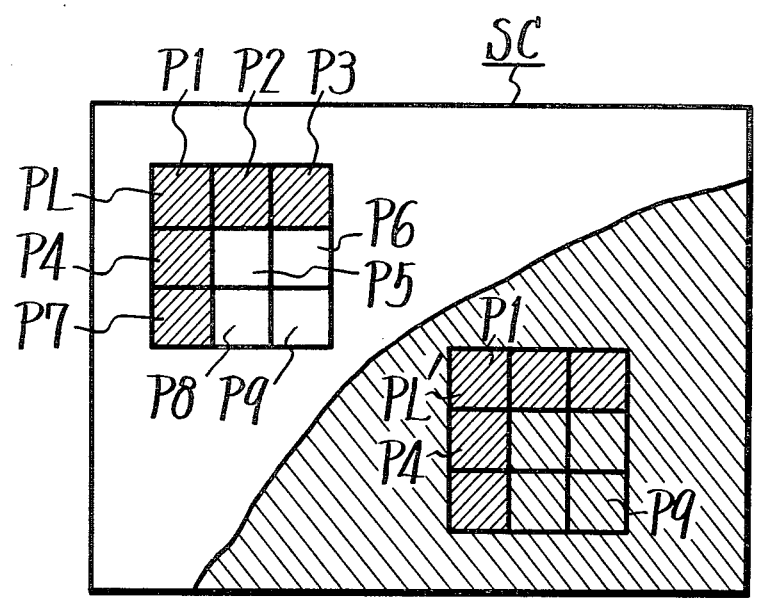
FIG. 6 is a schematic diagram explaining the invention.
Figure 7A:
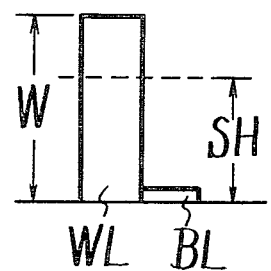
FIG. 7 is a graph explaining the invention.
Figure 7B:
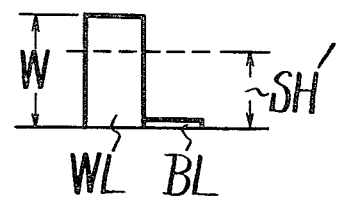

As shown in FIG. 6 and described above, a picture screen or screen SC is divided into a plurality of small picture screens each consisting of $3 \times 3 = 9$ picture elements P1, ..., P9 arranged in the horizontal and vertical directions. When an inverse L-shaped pattern, by way of example, is extracted from the screen SC, the information signal from the respective picture elements P1 to P9 are each divided into two values of black and white as set forth above. In FIG. 6, the inclined left upper portion of the screen SC with no hatching is a bright portion, while the inclined right lower portion of the screen SC with the hatching is a dark portion, respectively. Now, if the potentiometer PM is so adjusted that the threshold value set thereby, for example, $\frac{1}{3}$ of the level W of the highest input signal from the bright picture portion, the pattern PL of the small picture screen on the bright portion of the screen SC becomes such that its white level WL is higher than the threshold level SH and its black level BL is lower than the threshold value SH as shown in FIG. 7A. Thus, there is caused no error upon judging the black and white, and accordingly the pattern PL can be positively extracted from the screen SC.

In the case of the dark picture portion in the screen SC, as described above, the threshold level SH' is automatically set to $\frac{1}{3}$ of the level W of the highest signal of this dark portion, so that the white level WL is higher than the threshold level SH' and the black level BL is lower than the threshold level SH'. Therefore, in this case, the judgement of the black and white can also be positively carried out and hence the pattern PL can be accurately and positively extracted from the screen SC.

In the above description, the reducing factor of the potentiometer PM is selected as $\frac{1}{3}$, but it is of course not critical that the reducing factor be limited to the above value. It is of course possible to select the reducing factor in accordance with the degree of darkness and brightness of the screen SC to be scanned.

Further, in the above example of the invention, the peak selectors PS, each cosisting of the operational amplifier C1, diode D1 and resistor R1, whose number is same as that of the input signals, are used. It is, however, of not necessary that the peak selector PS be limited to the illustrated and described construction, but a peak selector consisting of, for example, only a diode may be employed or a peak selector with other construction may be used in this invention with the same effect.

Further, it is not essential that the screen, from which a pattern is extracted by utilizing the present invention, be limited so that the screen is divided into a plurality of small picture screens each consisting of 9 picture elements. That is, it is possible to form the respective small picture screen of picture elements whose number is a suitable one other than 9. In this case, it is sufficient that the circuit of the invention shown in FIG. 5 except the potentiometer PM be modified in response to the number of the picture elements used therein.

It wil be apparent that many modifications and variations could be effected by one skilled in the art without departing from the spirit or scope of the novel concepts of the present invention, so that the scope of the invention should be determined by the appended claims only.

I claim as my invention:

1. A threshold value setting circuit for use with a pattern discrimination circuit adapted in video apparatus in which an array of picture elements is scanned to provide corresponding picture element signals, said setting circuit comprising:

(a) a plurality of peak selectors and a threshold value setting means, each of said peak selectors having an input and output, each of said inputs being arranged to receive a respective one of said picture element signals, said outputs being connected together and in common to said threshold value setting means, each of said peak selectors providing an output from its respective input unless reverse-biased by a higher output from one of the other peak selectors; and (b) a plurality of comparators, corresponding to the number of peak selectors, each comparator having a pair of inputs and an output, one input of each of said comparators being connected to said common threshold value setting means and another input of each of said comparators being connected to receive a respective one of the picture element signals.

2. The threshold value setting circuit according to claim 1, in which each of said peak selectors comprises a resistor, an operational amplifier and a diode.

3. The threshold value setting circuit according to claim 1, or 2, in which said common threshold value setting means comprises a potentiometer.

* * * * *